(12) United States Patent
Joobeur et al.

(10) Patent No.: US 8,004,770 B2
(45) Date of Patent: Aug. 23, 2011

(54) PULSE MODIFIER WITH ADJUSTABLE ETENDUE

(75) Inventors: Adel Joobeur, Milford, CT (US); Oscar Franciscus Jozephus Noordman, Eindhoven (NL); Paul Van Der Veen, Waalre (NL); Arun Mahadevan Venkataraman, Norwalk, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/615,328

(22) Filed: Nov. 10, 2009

(65) Prior Publication Data

US 2010/0163757 A1 Jul. 1, 2010

Related U.S. Application Data

(60) Provisional application No. 61/142,004, filed on Dec. 31, 2008, provisional application No. 61/149,828, filed on Feb. 4, 2009.

(51) Int. Cl.
*G02B 27/14* (2006.01)
(52) U.S. Cl. ........................ 359/631; 359/633
(58) Field of Classification Search .................. 359/631, 359/633
See application file for complete search history.

(56) References Cited

U.S. PATENT DOCUMENTS

| 7,630,424 B2 | 12/2009 | Ershov et al. |
| 7,643,529 B2 | 1/2010 | Brown et al. |
| 2006/0126681 A1 | 6/2006 | Botma et al. |

FOREIGN PATENT DOCUMENTS

WO WO 2007/053335 A2 5/2007

OTHER PUBLICATIONS

Search Report and Examination mailed May 27, 2010 for European Application No. 09175033.1-1226, 8 pgs.
English translation of Korean Notification of Reasons for Refusal directed to related Korean Application No. 10-2009-0134501, Korean Intellectual Property Office, dated May 1, 2011; 6 pages.

*Primary Examiner* — William C Choi
(74) *Attorney, Agent, or Firm* — Sterne, Kessler, Goldstein & Fox P.L.L.C

(57) ABSTRACT

A beam modifying unit increases both temporal pulse length and Etendue of an illumination beam. The pulse modifying unit receives an input pulse of radiation and emits one or more corresponding output pulses of radiation. A beam splitter divides the incoming pulse into a first and a second pulse portion, and directs the first pulse portion along a second optical path and the second portion along a first optical path as a portion of an output beam. The second optical path includes a divergence optical element. A first and a second mirror, each with a radius of curvature, are disposed facing each other with a predetermined separation, and receive the second pulse portion to redirect the second portion, such that the optical path of the second portion through the pulse modifier is longer than that of the first portion, and the separation is less than radius of curvature.

10 Claims, 13 Drawing Sheets

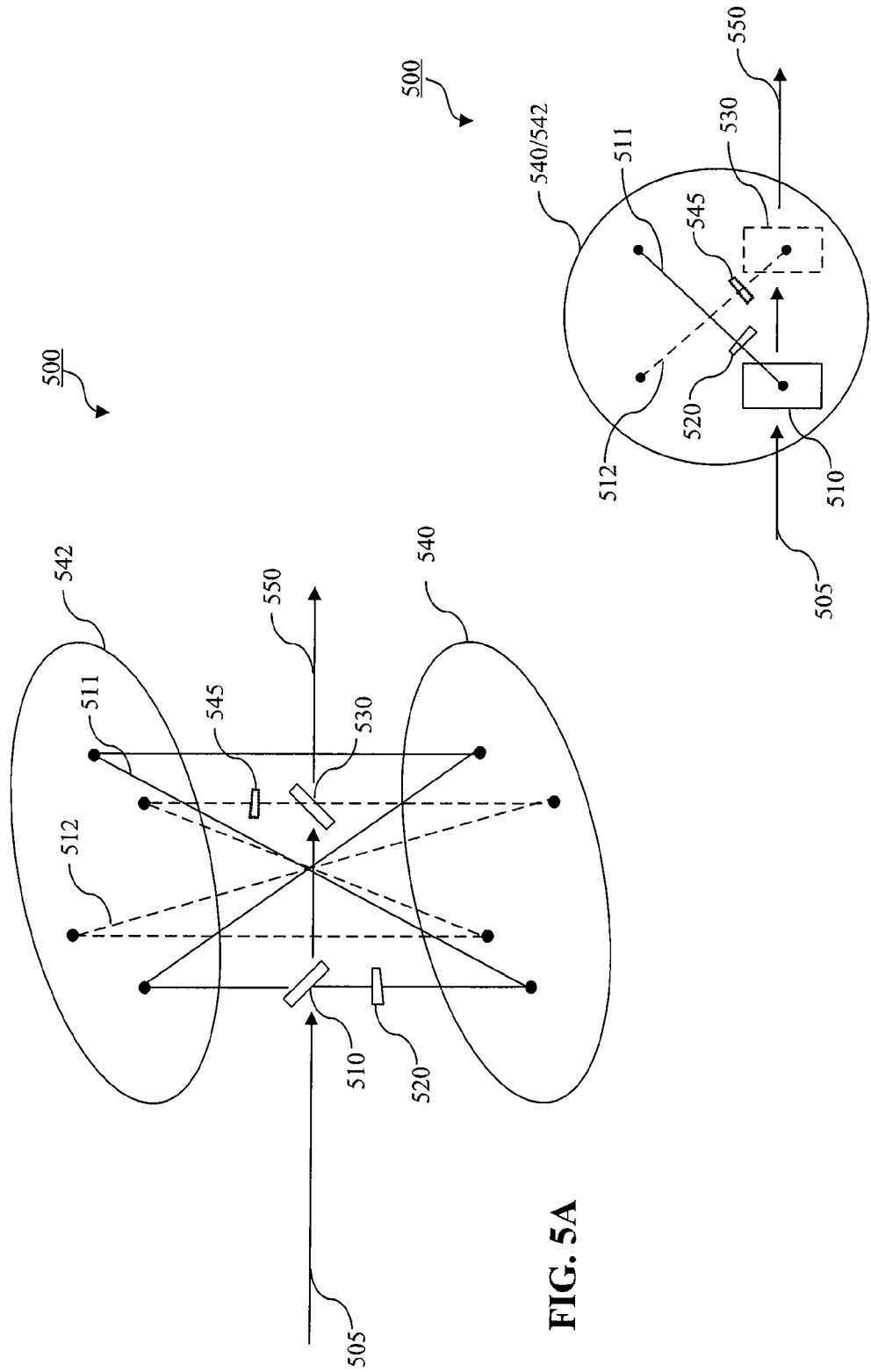

PULSE MODIFIER WITH ADJUSTABLE ETENDUE

CROSS REFERENCE TO RELATED APPLICATIONS

This application claims benefit under 35 U.S.C. §119(e) to U.S. Provisional Patent Applications: 61/142,004, filed Dec. 31, 2008 and 61/149,828, filed Feb. 4, 2009, which are both incorporated by reference herein in their entireties.

FIELD

The present invention generally relates to lithography, and more particularly to illumination pulse modification.

BACKGROUND

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device, which is alternatively referred to as a mask or a reticle, can be used to generate a circuit pattern to be formed on an individual layer in an IC. This pattern can be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned.

Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Typically, an excimer laser is used to supply the lithographic apparatus with radiation in the form of pulsed beams of radiation, e.g., high intensity ultraviolet pulses. Large, expensive lens elements can degrade after receiving billions of the pulses. Optical damage can increase with increasing intensity (i.e., light power (energy/time) per $cm^2$ or $mJ/ns/cm^2$) of the pulses. The typical pulse length from these lasers is about 20 ns, so a 5 mJ laser pulse would have a pulse power intensity of about 0.25 mJ/ns (0.25 MW). Increasing the pulse energy to 10 mJ without changing the pulse duration would result a doubling of the power of the pulses to about 0.5 mJ/ns, which can significantly shorten the usable lifetime of the lens elements.

Pulse stretchers can be configured for use with a lithographic apparatus to minimize optical damage and degradation by substantially increasing the pulse length. Increased pulse length is accomplished by creating copies of the pulse, where each copy is separated in time by using an optical delay.

Using known pulse stretching units can require an initial re-calibration of the lithographic apparatus. Also, the pulse stretching units can have no ability to control the size or direction of the beam without additional periodic calibration.

In addition, pulse stretching units can suffer from the generation of dynamic speckle. Speckle is a function of both the pulse duration as well as the Etendue of the beam. Speckle can be caused by a finite pulse length and limited spectral linewidth of partially coherent radiation from the laser. Speckle can cause a micro non-uniformity of the dose on the wafer resulting in a local variation of the size of the imaged features, often referred to as line width roughness (LWR). Speckle can be reduced by stretching the pulse duration over a period of time or by increasing the Etendue of the beam.

SUMMARY

Given the foregoing, what is needed is an improved method, apparatus, and system to provide a pulse modifier that increases both temporal pulse length and Etendue of an illumination beam.

Embodiments of the present invention include a pulse modifier with an adjustable Etendue comprising a beam splitter, a divergence optical element, and a first and second curved minor. The beam splitter receives an input pulse of radiation and divides the input pulse into a first and a second pulse portion. The beam splitter directs the first pulse portion towards a divergence optical element, which diverts the first pulse portion by an angle resulting in a divergence wherein Etendue is increased. The beam splitter directs the second pulse portion as a portion of the output beam. A first mirror and a second mirror, each with a radius of curvature, face each other with a predetermined separation and receive the diverted first pulse portion and redirect the first pulse portion along the diverted beam path. The optical path of the first pulse portion through the pulse modifier is longer than that of the second pulse portion, resulting in a delay and stretching of the input pulse.

Another embodiment of the present invention includes a pulse modifier with an adjustable Etendue comprising a beam splitter, a divergence optical element, and a first and second curved mirror where the beam splitter and divergence optical elements are combined into a single element. The divergence/beam splitter receives an input pulse of radiation and divides the input pulse into a first and a second pulse portion and diverts the first pulse portion by an angle resulting in a divergence wherein Etendue is increased. The divergence/beam splitter directs the second pulse portion as a portion of the output beam. A first minor and a second mirror, each with a radius of curvature, face each other with a predetermined separation and receive the diverted first pulse portion and redirect the first pulse portion along a beam path. The optical path of the first pulse portion through the pulse modifier is longer than that of the second pulse portion, resulting in a delay and stretching of the input pulse.

In yet another embodiment of the present invention a pulse modifier comprises a first and second beam splitter, a first and second divergence optical element, and a first and second curved mirror. The first divergence/beam splitter receives an input pulse of radiation and divides the input pulse into a first and a second pulse portion, directing the second portion of the beam towards the second beam splitter. The second beam splitter passes a fourth portion of the beam as at least a portion of the output beam. The first beam splitter redirects the first portion of the beam to a first divergence optical element that diverts the first pulse portion by an angle resulting in a divergence wherein Etendue is increased. The first divergence optical element is further produces a first beam path between the first and second reflecting devices where the first portion of the beam traverses between the first and second reflecting devices more than once. The second beam splitter redirects a third portion of the beam to a second divergence optical element that diverts the third pulse portion by an angle resulting in a divergence wherein Etendue is increased. The second divergence optical element further produces a second beam path between the first and second reflecting devices where the third portion of the beam traverses between the first and second reflecting devices more than once. After traversing between the first and second reflecting devices a portion of the first portion of the beam is reflected by the first beam splitter towards the second beam splitter while another portion of the first portion of the beam is passed through the first beam splitter. After traversing between the first and second reflecting devices a portion of the third portion of the beam is reflected by the second beam splitter and exits the system as a portion of an output beam while another portion of the third portion of the beam is passed through the second beam splitter.

Embodiments of the present invention further include a lithography system with a pulse modifier. The lithography system consists of an illumination system to condition a radiation beam for illumination of a patterning device, wherein the illumination system contains a pulse modifier. The pulse modifier includes a first and second beam splitter, a first and second divergence optical element, and a first and second curved mirror where the beam splitter and divergence optical elements are combined into a single element. The first divergence/beam splitter receives an input pulse of radiation and divides the input pulse into a first and a second pulse portion, directing the second portion of the beam towards the second divergence/beam splitter. The second divergence/beam splitter passes a fourth portion of the beam as at least a portion of the output beam. The first divergence/beam splitter is also configured to tilt and redirect the first portion of the beam to produce a first beam path between the first and second reflecting devices where the first portion of the beam traverses between the first and second reflecting devices more than once. The second divergence/beam splitter tilts and redirects a third portion of the beam to produce a second beam path between the first and second reflecting devices where the third portion of the beam traverses between the first and second reflecting devices more than once. After traversing between the first and second reflecting devices a portion of the first portion of the beam is reflected by the beam splitter towards the second beam splitter while another portion of the first portion of the beam is passed through the first beam splitter. After traversing between the first and second reflecting devices a portion of the third portion of the beam is reflected by the beam splitter and exits the system as a portion of an output beam while another portion of the third portion of the beam is passed through the beam splitter.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 5A is a three dimensional illustration of a symmetric pulse modifier. according to an embodiment of the present invention.

FIG. 5B is a top view of a symmetric pulse modifier, according to an embodiment of the present invention.

Figure 1A:
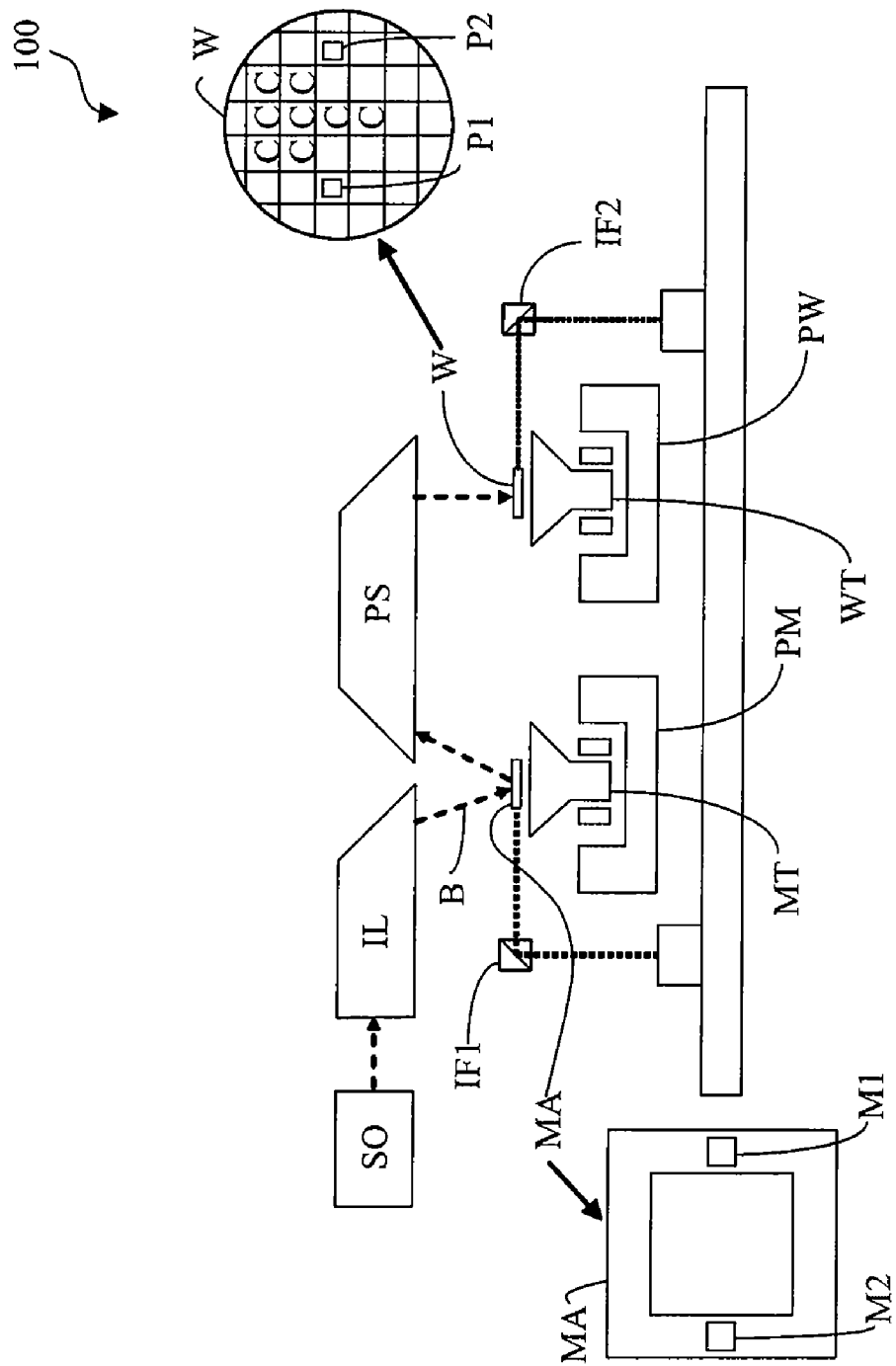
FIG. 1A is an illustration of a reflective lithographic apparatus, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Embodiments of the present invention are directed to a pulse modifier with adjustable Etendue. This specification discloses one or more embodiments that incorporate the features of the present invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention can be implemented in hardware, firmware, software, or any combination thereof. Embodiments of the present invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include the following: read-only memory (ROM); random access memory (RAM); magnetic disk storage media; optical storage media; and, flash memory devices. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 is an illustration of a lithographic apparatus 100 and lithographic apparatus 100', respectively, in which embodiments of the present invention can be implemented. Lithographic apparatus 100 and lithographic apparatus 100' each include the following: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and, a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

Figure 1B:
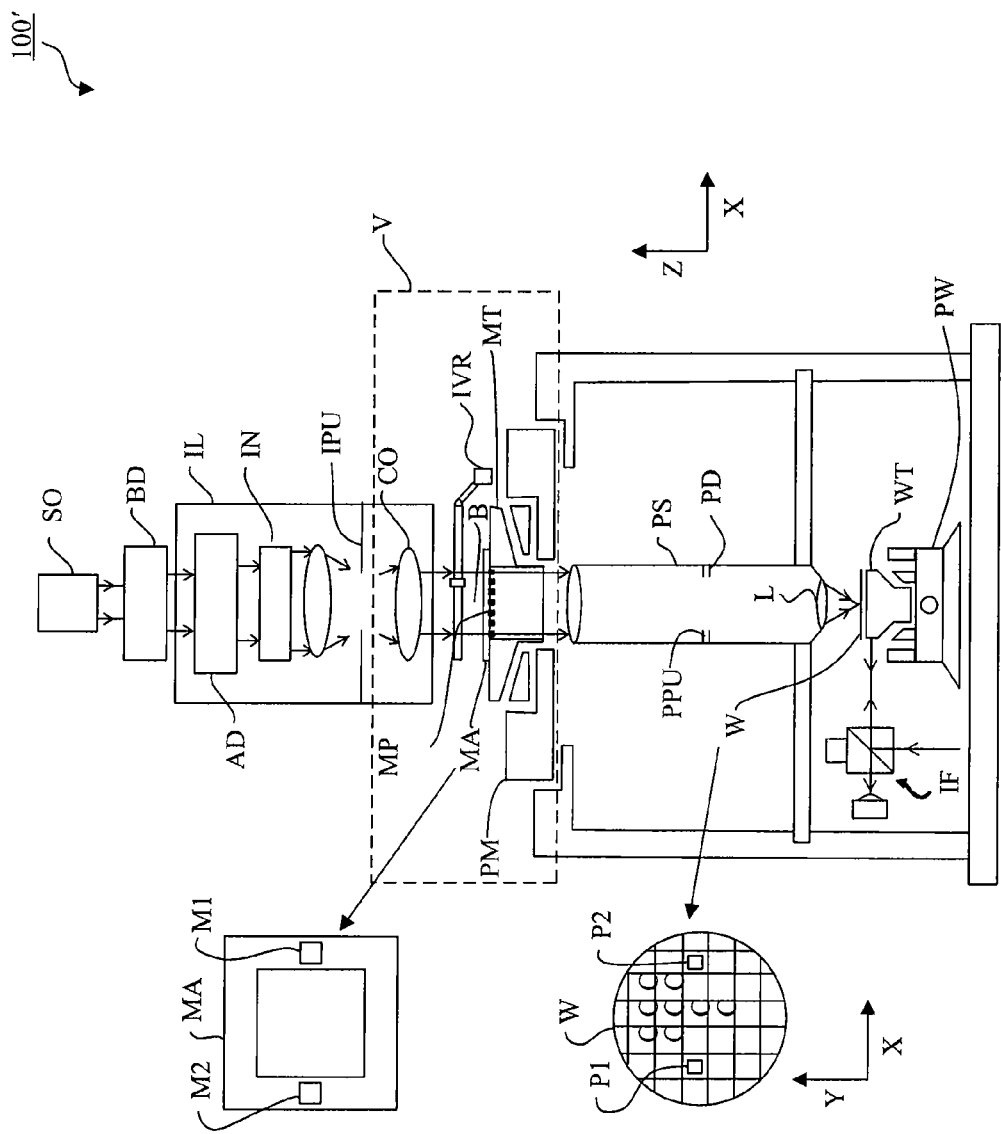
FIG. 1B is an illustration of a transmissive lithographic apparatus, according to an embodiment of the present invention.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder, or capacitive sensor), the substrate table WT can be moved accurately (e.g., so as to position different target portions C in the path of the radiation beam B). Similarly, the first positioner PM and another position sensor IF1 can be used to accurately position the patterning device (e.g., mask) MA with respect to the path of the radiation beam B. Patterning device (e.g., mask) MA and substrate W can be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately (e.g., so as to position different target portions C in the path of the radiation beam B). Similarly, the first positioner PM and another position sensor (not shown in FIG. 1B) can be used to accurately position the mask MA with respect to the path of the radiation beam B (e.g., after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner) the mask table MT can be connected to a short-stroke actuator only or can be fixed. Mask MA and substrate W can be aligned using mask alignment marks M1, M2 and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

The lithographic apparatuses 100 and 100' can be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT can be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (e.g., having a wavelength $\lambda$ of 365, 248, 193, 157 or 126 nm), extreme ultraviolet (EUV or soft X-ray) radiation (e.g., having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Figure 2A:
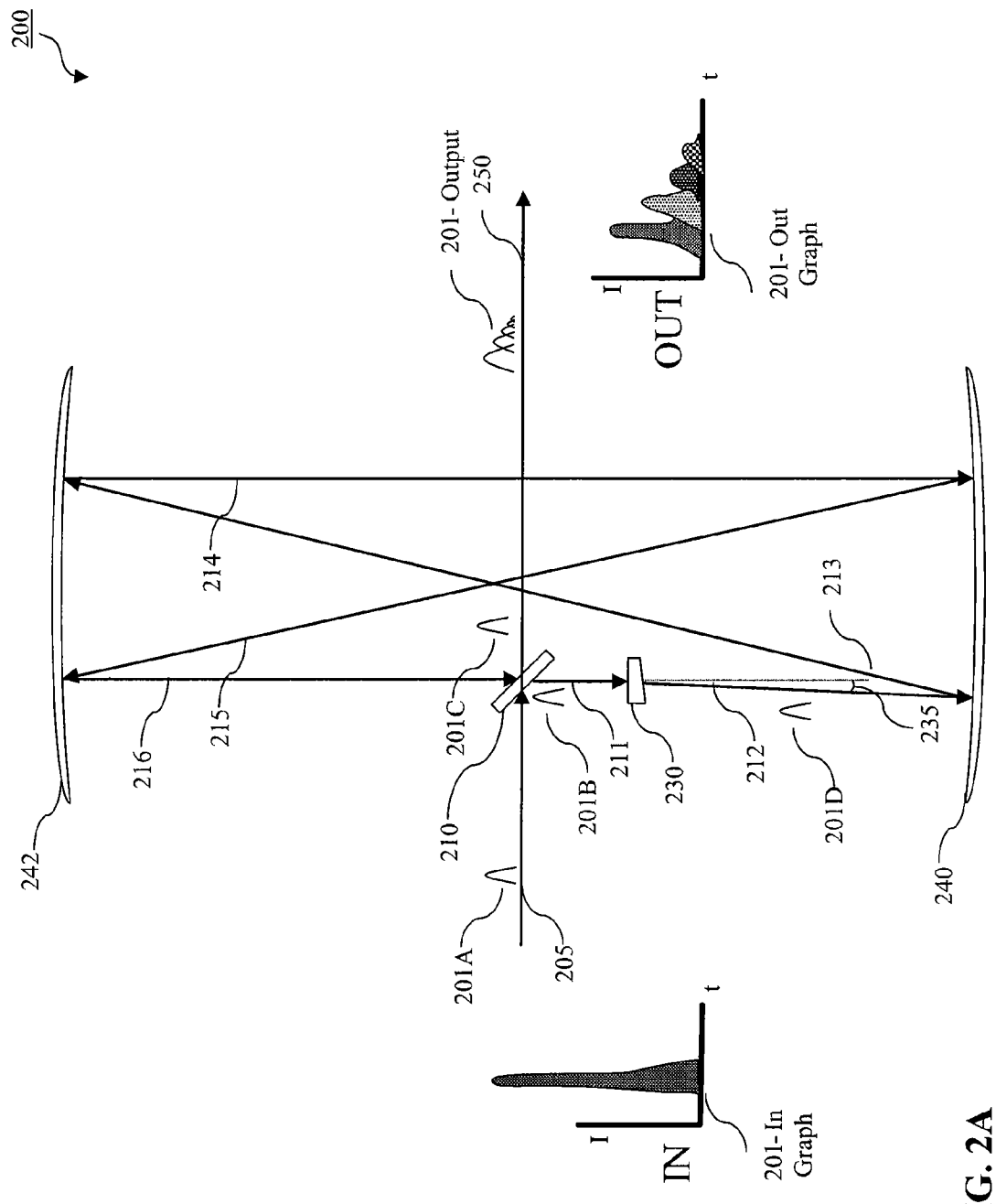
FIG. 2A is an illustration of an asymmetric pulse modifier using one beam splitter and one divergence optical element, according to an embodiment of the present invention.

FIG. 2A is an illustration of a beam modifier 200 (e.g., an asymmetric beam modifier with adjustable Etendue), according to an embodiment of the invention.

In this example, beam modifier 200 includes a beam splitter 210, a divergence optical element 230, and first and second curved reflecting devices 240 and 242.

In one example, the following beam path or cycle is traversed by at least one beam of radiation entering beam modifier 200. Input pulse 201A enters asymmetric beam modifier 200 along beam path 205. For example, an example waveshape is shown graphed as 201-In Graph. Input pulse 201A is divided by beam splitter 210 into two pulse portions including reflected pulse portion 201B and transmitted pulse portion 201C. Portion 201C exits asymmetric beam modifier 200 as a portion of output beam 201-Output. Portion 201B travels along beam path 211 towards divergence optical element 230. Divergence optical element 230, e.g., an optical wedge, diverges (e.g. tilts) portion 201B so that portion 201B travels along beam path 212, diverging from beam path 211 by angle 235. An angle of divergence from path 211 depends on an angle of divergence optical element 230. Portion 201D reflects from mirror 240 to travel along beam path 213. Minor 242 reflects portion 201D to travel along beam path 214 to first minor 240. Portion 201D reflects from mirror 240 to travel along beam path 215 to mirror 242. Portion 201D reflects from mirror 242 and travels back to beam splitter 210 along beam path 216. Portion 201D is divided by beam splitter 210. The reflected part of portion 201D again forms part of 201-Output.

In this example, portion 201D is delayed in time because it travels along a longer beam path than portion 201C. Also, the reflected part of portion 201D added to 201-Output has lower intensity than 201C pulse portion.

In one example, the transmitted part of portion 201D can then repeat the cycle. In each cycle pass divergence optical element 230 further tilts the beam.

In this embodiment, as there is only a single divergence optical element 230, and therefore 201-Output is asymmetric.

The reflective surfaces of two curved minors 240 and 242 face each other. The curved mirrors are separated by a predetermined distance or separation, for example the distance or separation can be approximately equal to the radius of curvature of each curved minor. For example, curved minors 240 and 242 form a confocal mirror with a radius of curvature of 2d, where d is the separation distance between mirrors 240 and 242. In one example, curved minors 240 and 242 are configured to reimage a portion of the beam at beam splitter 210.

In one example, beam splitter 210 can be configured to any desired ratio of reflection to transmission. For example, when using a 60R/40T (60% reflection and 40% transmissions) beam splitter 210 with negligible loss, portion 201B represents 60% of input pulse 201A, while portion 201C represents 40% of input pulse 201A. In this example, 201-Ouput is produced from a series of time delayed, intensity reduced, and tilted series of pulses. After a first cycle, portion 201C is about 60% of the intensity of input pulse 201A. After an optional second cycle, 201-Output is about 24% of the of the intensity of original input pulse 201A. Similarly, a third cycle generates about 9.6%, a fourth cycle generates about 3.9%, and a fifth cycle generates about 1.5% of the original intensity of 201A. Therefore, after a certain number of pulses, the intensity of 201A can completely dissipate.

In one example, a time delay between the pulses which constitute 201-Output is based on path length of beam paths 211, 212, 213, 214, 215 and 216. Some of the beam paths are defined by the separation between mirrors 240 and 242. The separation can be designed to allow for overlapping, adjacent, or separated output pulses. The result of such time delays between the pulses that are used to produce 201-Output is a increase in the temporal pulse of an illumination beam.

A relative intensity of the output pulses with respect to the input pulse and with respect to each other is influenced by the reflection/transmission ratio of beam splitter 210. A degree of divergence is a function of the degree of tilt in the divergence optical element, which can also be adjusted.

Figure 2B:
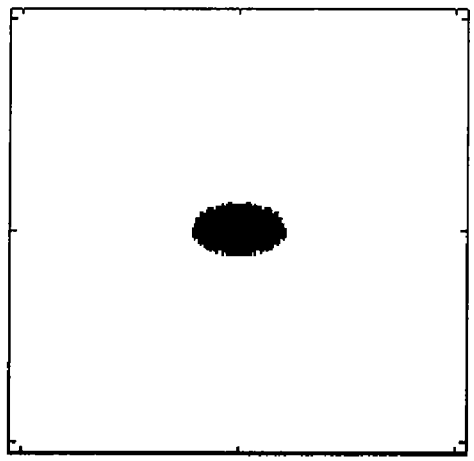
FIGS. 2B and 2C illustrate a cross section of an input beam to an asymmetric pulse modifier and a cross section of the corresponding output beam.

FIG. 2B illustrates a shape of an input pulse, such as input pulse 201A, according to an embodiment of the present invention.

Figure 2C:
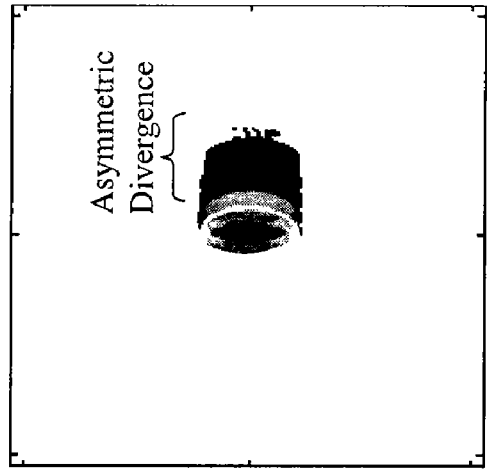

FIG. 2C illustrates a shape of a corresponding output beam, such as 201-Output, with an asymmetrical divergence shown on the right side of the Output Pulses, according to an embodiment of the invention. In this manner, the divergence of the beam is increased without decreasing the beam size, thus increasing the Etendue.

In lithography, speckle is a function of both the pulse duration and the Etendue of the beam. Therefore, by increasing the time delay between output pulses, as well as the Etendue, as described in the above embodiment, speckle can be substantially reduced and/or eliminated by stretching the pulse duration over a period of time and/or by increasing the Etendue of the beam.

Figure 3:
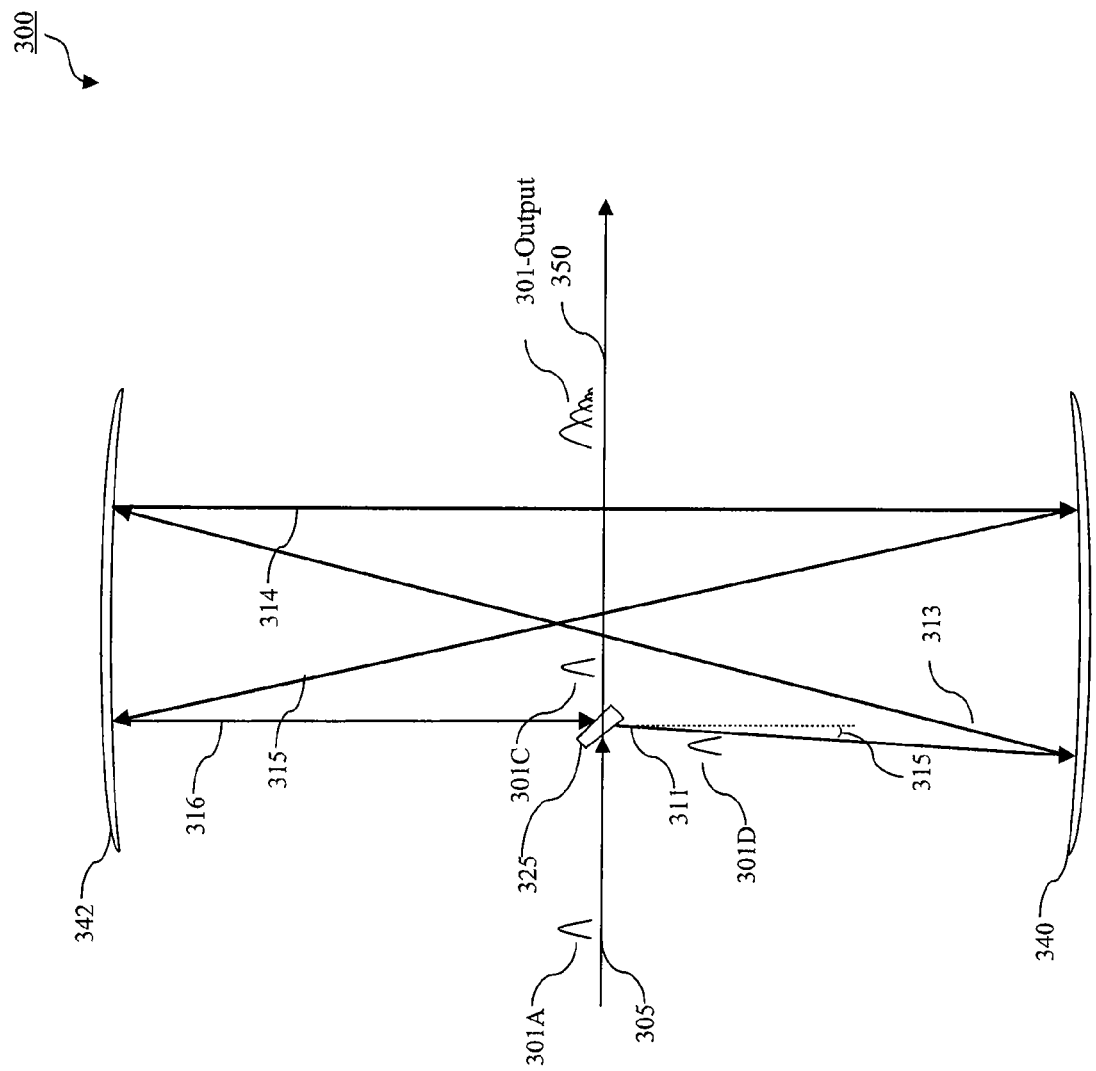
FIG. 3 is an illustration of an asymmetric pulse modifier using a combined divergence/beam splitter, according to an embodiment of the present invention.

FIG. 3 is an illustration of a beam modifier 300, according to an embodiment of the invention. For example, beam modifier 300 can be an asymmetric beam modifier with adjustable Etendue using a combined beam splitter and divergence optical element 325. Beam modifier 300 operates similarly to beam modifier 200 in the embodiment shown in FIG. 2. However, a beam splitter function is combined with the divergence function through element 325. Beam modifier 300 also includes reflecting devices 340 and 342.

In one example, an cycle of a beam traveling through beam modifier includes input pulse 301A traveling along beam path 305, which is divided and diverged by element 325. Input pulse 301A is divided into two pulse portions consisting of diverged and reflected pulse portion 301D and transmitted pulse portion 301C. Element 325 tilts the reflected pulse portion of input pulse 301A to generate a diverged and reflected portion 301D, which is tilted by an angle 315 along beam path 311. Portion 301D reflects from mirror 340, travels along beam path 313, reflects from mirror 342, travels along beam path 314, reflects from mirror 340, travels along beam path 315, reflects from mirror 342, and travels back to element splitter 325. Portion 301D is again divided by element 325. The reflected part of portion 301D again forms part of to 301-Output. In one example, the transmitted part of portion 301D repeats the cycle, and further contributes to 301-Output.

As discussed above, as portion 301D travels along a longer beam path than pulse portion 301C, pulse portion 301D is delayed in time. Also, as described above, as the reflected part of portion 301D is again split by element 325, the reflected part of portion 301D that is added to 301-Output has a lower intensity than portion 301C. As further discussed above, after a certain number of cycles, the original energy of pulse 301A is substantially completely dissipated.

In this embodiment, as there is only a single element 325, the 301-Output is asymmetric. These attributes will not be repeated for systems discussed below, although a skilled artisan will understand that any systems discussed below can also have these attributes.

In one example, a beam splitting functionality of element 325 can be configured to any desired ratio of reflection to transmission. If, for example, a 60R/40T (60% reflection and 40% transmissions) beam splitting characteristic is used for element 325, and assuming negligible loss at element 325, portion 301D represents 60% of input pulse 301A, while transmitted pulse portion 301C represents 40% of input pulse 301A. These attributes will not be repeated for systems discussed below, although a skilled artisan will understand that any systems discussed below can also have these attributes.

Figure 4A:
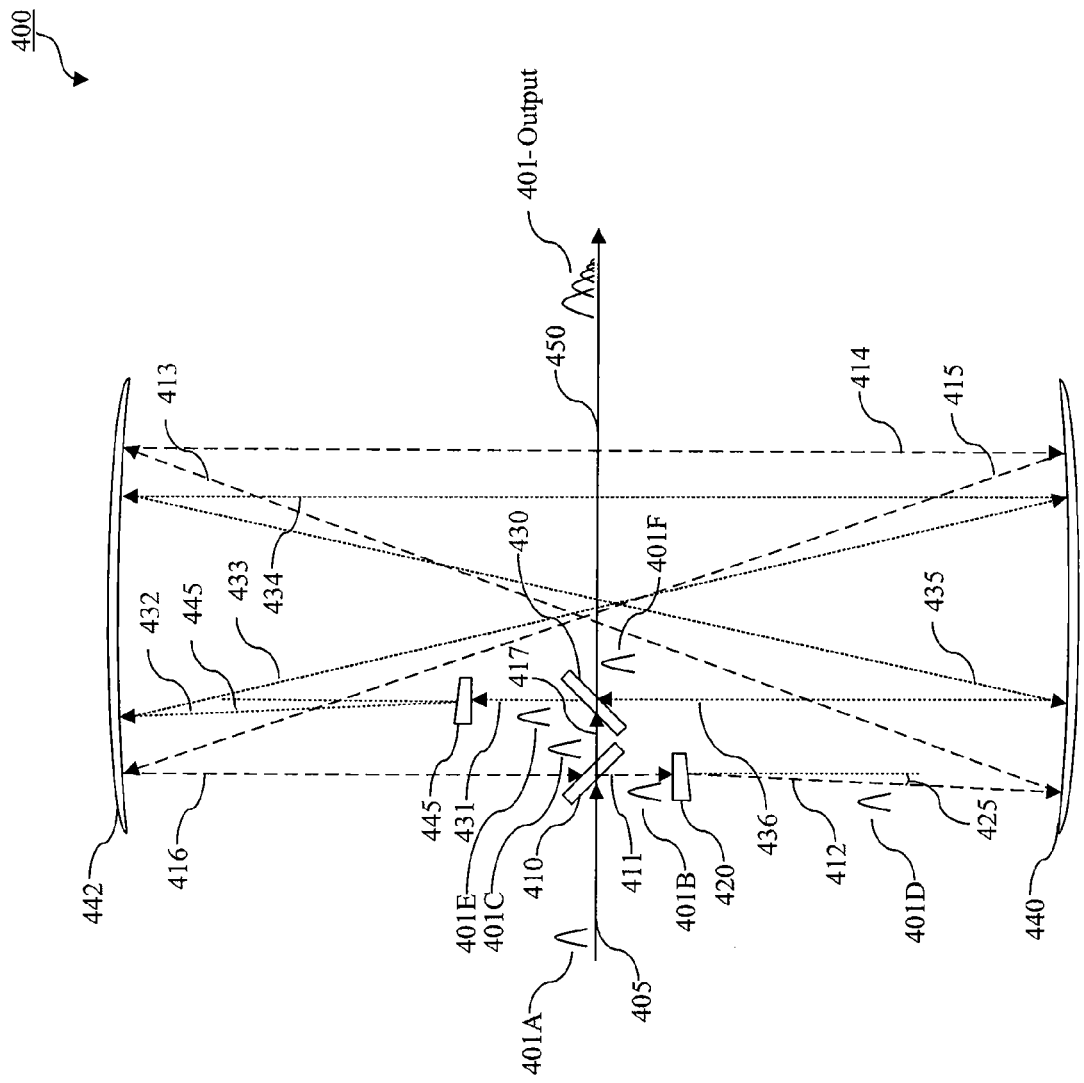
FIG. 4A is an illustration of a symmetric pulse modifier using two beam splitters and two divergence optical elements with multiple reflections, according to an embodiment of the present invention.

FIG. 4A is an illustration of a beam modifier 400 (e.g., a symmetric beam modifier with adjustable Etendue), according to an embodiment of the invention.

In this example, beam modifier 400 includes first and second beam splitters 410 and 430, first and second divergence optional elements 420 and 430, and first and second curved reflecting devices 440 and 442.

In one example, the following beam path or cycle is traversed by at least one beam of radiation entering beam modifier 400. Input pulse 401A enters symmetric beam modifier 400 along beam path 405. Input pulse 401A is divided by first beam splitter 410 into two pulse portions including reflected pulse portion 401B and transmitted pulse portion 401C. Portion 401C travels along beam path 417 to the second beam splitter 430, where portion 401C is divided into a reflected pulse portion, pulse portion 401E, and a transmitted pulse portion, pulse portion 401F. Portion 401F exits symmetric beam modifier 400 as a portion of output beam 401-Output.

In this example, input pulse 401A is divided by both first and second beam splitters, 410 and 430, to travel two sets of independent beam paths which can exist in separate planes. The first division of input pulse 401A is accomplished by first beam splitter 410, and diverged of portion 401B is performed by first divergence optical element 420, such that portion 401B travels along beam paths 411, 412, 413, 414, 415, and 416. The second division of beam 401A is portion 401C, which is accomplished by second beam splitter 430, and diverged of portion 401E is performed by second divergence optical element 445, and portion 401E travels along beam paths 431, 432, 433, 434, 435, and 436.

In this example, portion 401B travels along beam path 411 towards first divergence optical element 420. Divergence optical element 420, e.g., an optical wedge, diverges (e.g., tilts) portion 401B so that portion 401B travels along beam path 412, diverging from beam path 411 by angle 425. An angle of divergence from path 411 depends on an angle of divergence optical element 420. Portion 401D reflects from mirror 440 to travel along beam path 413. Mirror 442 reflects portion 401D to travel along beam path 414 to mirror 440. Portion 401D reflects from mirror 440 to travel along beam path 415 to mirror 442. Portion 401D reflects from mirror 442 and travels along beam path 416 back to first beam splitter 410. Portion 401D is further divided by first beam splitter 410, so that a reflected portion is directed along beam path 417 to second beam splitter 430 and a transmitted portion travels on path 411 for an optional additional cycle pass.

In this example, portion 401D is delayed in time because it travels along a longer beam path than portion 401C. Also, the reflected part of portion 401D that travels to second beam splitter 430 has lower intensity than portion 401C.

In one example, the transmitted part of portion 401D can then repeat the cycle. In each cycle pass, divergence optical element 420 further tilts the beam in addition to the delay associated with the beam paths.

After the first cycle, or optional additional cycles, transmitted pulse portion 401C of input pulse portion 401A travels along beam path 417 to second beam splitter 430 where it is divided into two pulse portions including reflected pulse portion 401E and transmitted pulse portion 401F. Portion 401F exits symmetric beam modifier 400 as a portion of output beam 401-Output.

Also, in this example, portion 401E travels along beam path 431 towards second divergence optical element 445. Second divergence optical element 445, e.g., an optical wedge, diverges (e.g., tilts) portion 401E so that portion 401E travels along beam path 432. An angle of divergence from path 431 depends on an angle of second divergence optical element 445. Portion 401E reflects from mirror 442 to travel along beam path 433. Mirror 440 reflects portion 401E to travel along beam path 434 to mirror 442. Portion 401E reflects from mirror 442 to travel along beam path 435 to mirror 440. Portion 401E reflects from mirror 440 and travels along beam path 436 back to second beam splitter 430. Portion 401E is further divided by second beam splitter 430, such that a reflected portion is directed along beam path 450 as a portion of output beam 401-Output and a transmitted portion travels on path 417 for a optional additional cycle pass.

In this example, portion 401E is delayed in time because it travels along a longer beam path than portion 401F. Also, the reflected part of portion 401E that exits has lower intensity than 401F pulse portion.

In one example, the transmitted part of portion 401E can then repeat the cycle. In each cycle pass, second divergence optical element 445 further tilts the beam in addition to the delay associated with the beam paths.

In one example, the reflective surfaces of two curved mirrors 440 and 442 face each other. The curved mirrors are separated by a predetermined distance or separation, for example the distance or separation can be approximately equal to the radius of curvature of each curved mirror. For example, curved mirrors 440 and 442 form a confocal mirror with a radius of curvature of 2d, where d is the separation distance between mirrors 440 and 442.

As the embodiment in FIG. 4 consists of two sets of beam splitters and divergence optical elements, such splitters and optical elements can be positioned such that the output beam of FIG. 4, 401-Output, is symmetric.

Figure 4B:
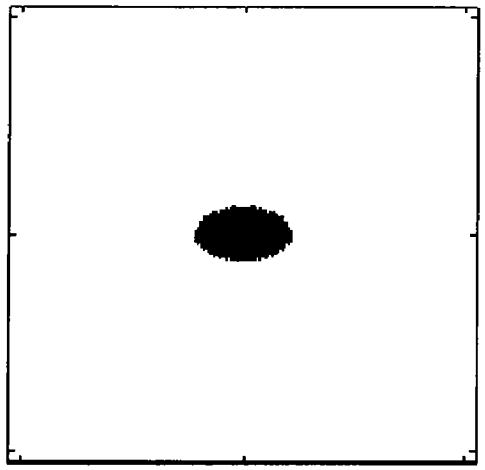
FIGS. 4B and 4C illustrate a cross section of an input beam to a symmetric pulse modifier and a cross section of a corresponding output beam. according to an embodiment of the present invention.

FIG. 4B illustrates a shape of an input pulse, such as input pulse 401A, according to an embodiment of the present invention.

Figure 4C:
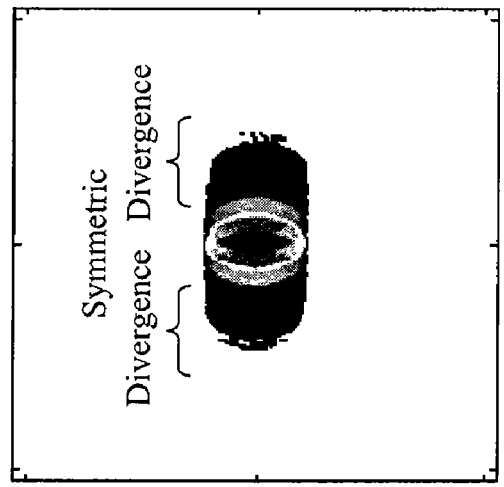

FIG. 4C illustrates a shape of a corresponding output beam, such as 401-Output, with a symmetric output divergence shown on both the left and right side of the Output Pulses, according to an embodiment of the invention. In this manner the divergence of the beam is increased without decreasing the beam size, thus increasing the Etendue.

In other embodiments, additional beam splitters and divergence optical elements can be configured to increase the divergence and Etendue in other planes, such that the increased divergence can occur in both the horizontal direction, as shown in FIG. 4C, but also in a vertical direction. There is no limitation on the number or positions of beam splitters and divergence optical elements that can be used to modify a beam with increased Etendue.

FIGS. 5A and 5B are three dimensional illustrations of a beam modifier 500, according to an embodiment of the present invention. For example, beam modifier 500 can be a symmetric beam modifier with adjustable Etendue. Beam modifier 500 operates similarly to beam modifier 400 in the embodiment shown in FIG. 4. However, in this embodiment the planes of the beam paths from the beam splitters are symmetric.

In this example, beam modifier 500 includes two beam splitters, 510 and 530, two divergence optical elements 520 and 545, and two mirrors, 540 and 542.

An input pulse travels along beam path 505 before being divided by first beam splitter 510. A reflected portion of the beam is diverged by first divergence optical element 520 to travel along beam path 511. A transmitted potion of the beam travels to second beam splitter 530. Based on beam splitter 530, a reflected portion is diverged by second divergence optical element 545 along beam path 512, and a transmitted portion exits along beam path 550.

FIG. 5B illustrates a top view of this embodiment shown in FIG. 5a, which shows beam paths 511 and 512 existing in perpendicular planes.

In further embodiments, additional beam splitters and divergence optical elements can be added to generate additional planes of beam paths, which are all ultimately directed to the output beam along beam path 550.

Figures 5C, 5D:
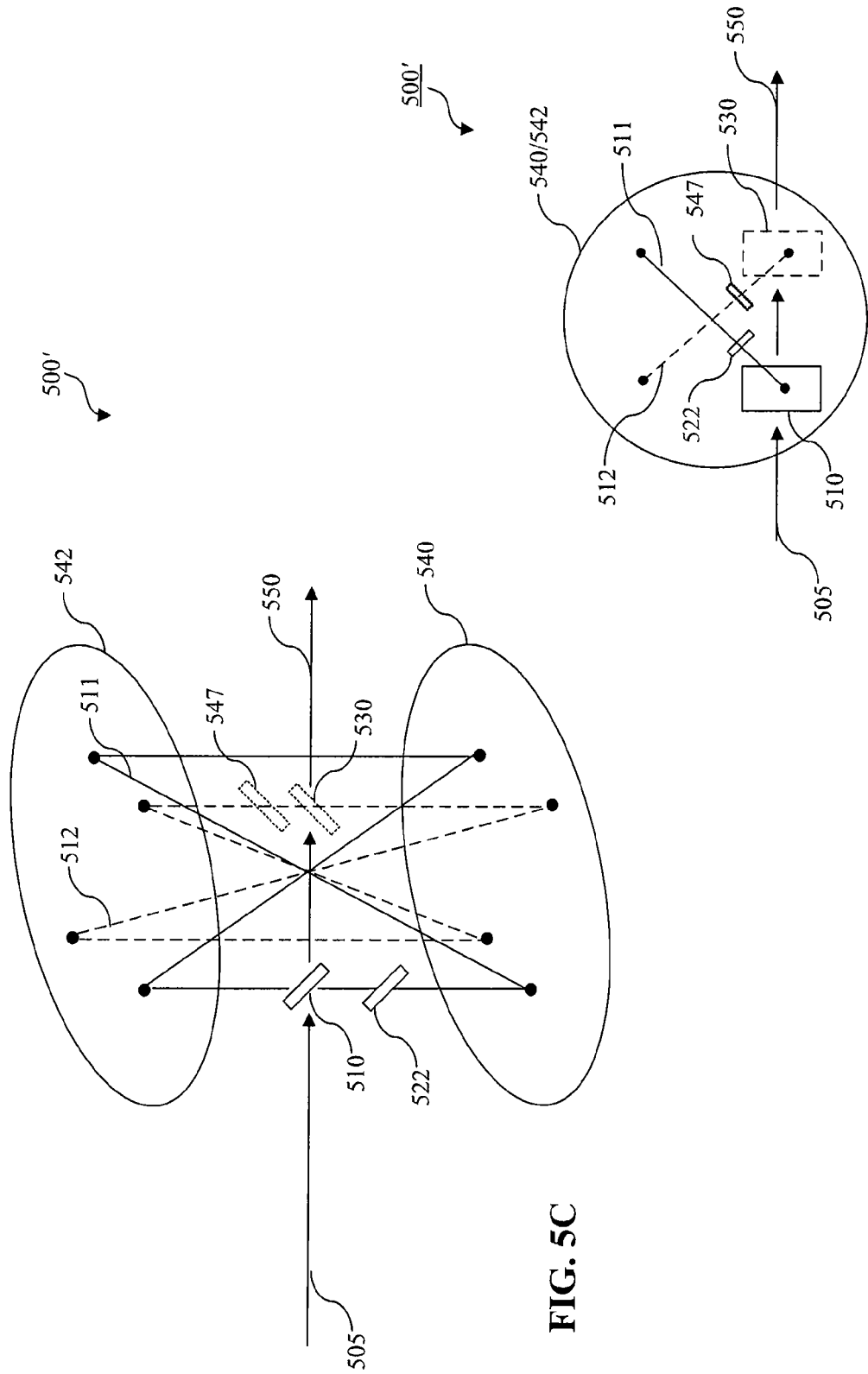
FIG. 5C is a beam modifier, according to an embodiment of the present invention.
FIG. 5D is a top view of a beam modifier, according to an embodiment of the present invention.

FIGS. 5C and 5D illustrate a beam modifier 500', according to an embodiment of the present invention. For example, beam modifier 500' can be a symmetric beam modifier with adjustable Etendue. Beam modifier 500' operates similarly to beam modifier 500 in the embodiment shown in FIGS. 5A and 5B. However, in this embodiment the divergence optical elements are replaced by parallel plate optical elements.

In this example, beam modifier 500' includes two beam splitters 510 and 530, two parallel plate optical elements 522 and 547, and two mirrors 540 and 542.

An input pulse travels along beam path 505 before being divided by first beam splitter 510. A reflected portion of the beam is shifted by first parallel plate optical element 522 to travel along beam path 511. A transmitted potion of the beam travels to second beam splitter 530. Based on beam splitter 530, a reflected portion is shifted by second parallel plate optical element 547 along beam path 512, and a transmitted portion exits along beam path 550. Parallel plate optical elements 522 and 547 are tilted about an axis perpendicular to the beam propagation direction so that the size of the beam is increased without modifying the divergence of the beam, thus increasing the Etendue of the beam.

FIG. 5D illustrates a top view of the embodiment shown in FIG. 5C, which shows beam paths 511 and 512 existing in perpendicular planes.

In further embodiments, additional beam splitters and parallel plate optical elements can be added to generate additional planes of beam paths, which are all ultimately directed to the output beam along beam path 550.

In another embodiment, parallel plate optical element 522 is combined with beam splitter 510 to form a relatively thicker beam splitter to accomplish the same result.

Figure 6:
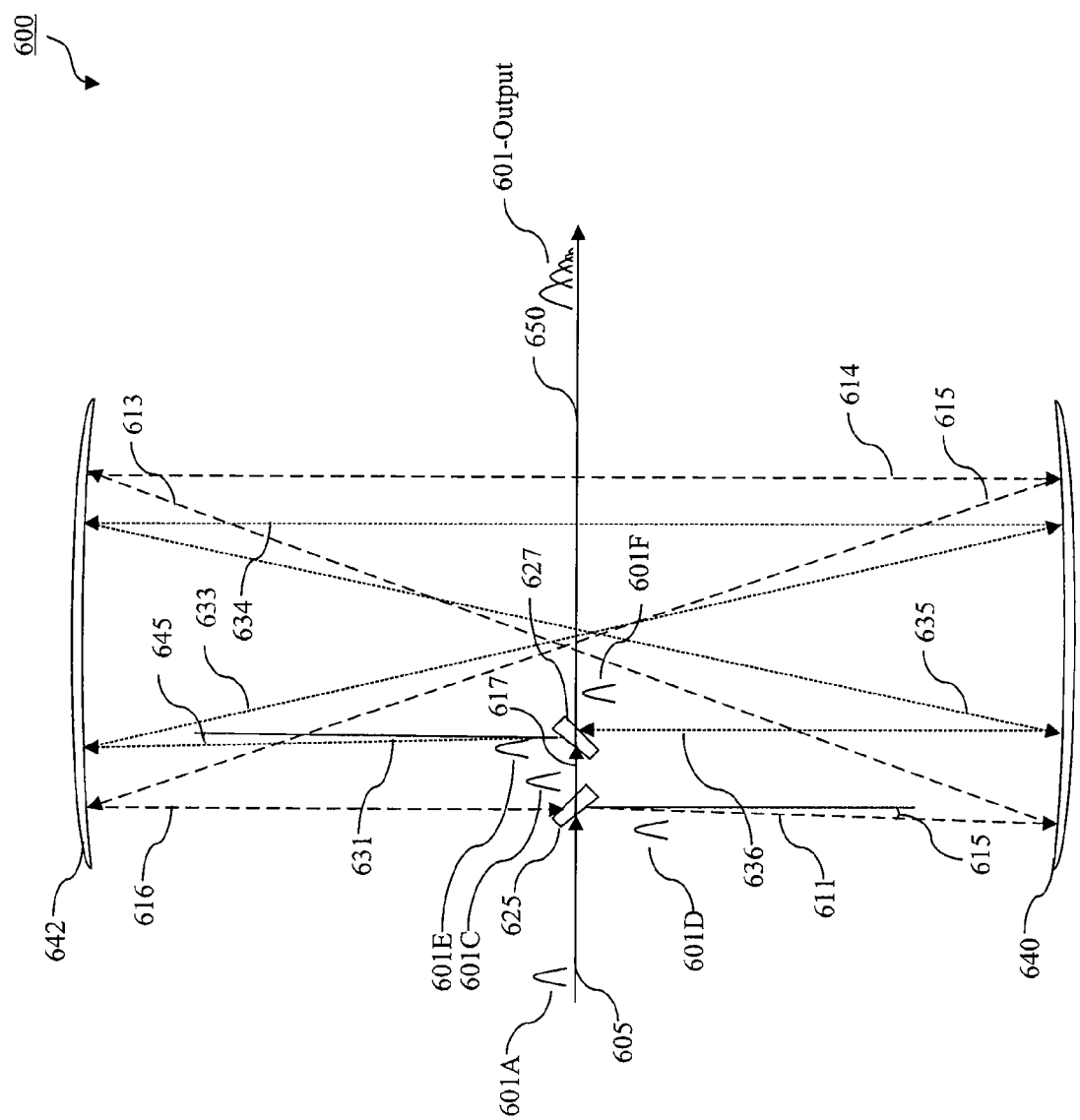
FIG. 6 is an illustration of a symmetric pulse modifier using a combined divergence/beam splitter, according to an embodiment of the present invention.

FIG. 6 is an illustration of a beam modifier 600, according to an embodiment of the invention. For example, beam modifier 600 can be a symmetric beam modifier with adjustable Etendue using a combined beam splitter and divergence optical element. Beam modifier 600 operates similarly to beam modifier 400 in the embodiment shown in FIG. 4. However, a beam splitter function is combined with the divergence function, similar to as described for the embodiment of FIG. 3.

In this example, beam modifier 600 includes first and second divergence/beam splitting elements 625 and 627, and first and second curved reflecting devices 640 and 642.

In one example, the following beam path or cycle is traversed by at least one beam of radiation entering beam modifier 600. Input pulse 601A enters beam modifier 600 along beam path 605. Input pulse 601A is divided into two pulse portions consisting of diverged and reflected pulse portion 601D and transmitted pulse portion 601C. Portion 601C travels along beam path 617 to second divergence/beam splitting element 627, such that portion 601C is divided into a reflected pulse portion 601E and a transmitted pulse portion 601F. Portion 601F exits symmetric beam modifier 600 as a portion of output beam 601-Output.

In this example, element 625 tilts the reflected pulse portion of input pulse 601A to generate a diverged and reflected portion 601D, which is tilted by an angle 615 along beam path 611. Portion 601D reflects from mirror 640 to travel along beam path 613. Mirror 642 reflects portion 601D to travel along beam path 614 to mirror 640. Portion 601D reflects from mirror 640 to travel along beam path 615 to mirror 642. Portion 601D reflects from mirror 642 and travels along beam path 616 back to element 625. Portion 601D is further divided by element 625, such that a reflected portion of split portion 601D is directed along beam path 617 to element 627 and a transmitted portion of portion 601D travels on path 611 for another cycle pass.

In this example, portion 601D is delayed in time because it travels along a longer beam path than portion 601C. Also, the reflected part of portion 601D that travels to element 627 has lower intensity than 601C pulse portion.

In one example, the transmitted part of portion 601D can then repeat the cycle. In each cycle pass, element 625 further tilts the beam in addition to the delay associated with the beam paths.

In this example, transmitted pulse portion 601C of input pulse portion 601A travels along beam path 617 to element 627, where it is divided into two pulse portions including reflected and diverged pulse portion 601E and transmitted pulse portion 601F. Portion 601F exits symmetric beam modifier 600 as a portion of output beam 601-Output.

Element 627 tilts the reflected pulse portion of pulse portion 601C to generate a diverged and reflected portion 601E, which is tilted by an angle 645 along beam path 631. Portion 601E reflects from mirror 642 to travel along beam path 633. Portion 601E reflects from mirror 642 to travel along beam path 633. Mirror 640 reflects portion 601E to travel along beam path 634 to mirror 642. Portion 401E reflects from mirror 642 to travel along beam path 635 to mirror 640. Portion 601E reflects from mirror 640 and travels back to second divergence/beam splitter 627 along beam path 636. Portion 401E is further divided by element 627, where a reflected portion is directed along beam path 650 as a portion of output beam 601-Output and the transmitted portion travels on path 617 for another cycle pass.

In this example, portion 601E is delayed in time because it travels along a longer beam path than portion 601F. Also, the reflected part of portion 601E that exits has lower intensity than 601F pulse portion.

In one example, the transmitted part of portion 601E can then repeat the cycle. In each cycle pass, element 627 further tilts the beam in addition to the delay associated with the beam paths.

In this example, the reflective surfaces of two curved mirrors 640 and 642 face each other. The curved mirrors are separated by a predetermined distance or separation, for example the distance or separation can be approximately equal to the radius of curvature of each curved mirror. For example, curved mirrors 640 and 642 form a confocal mirror with a radius of curvature of 2d, where d is the separation distance between mirrors 640 and 642.

Figure 7:
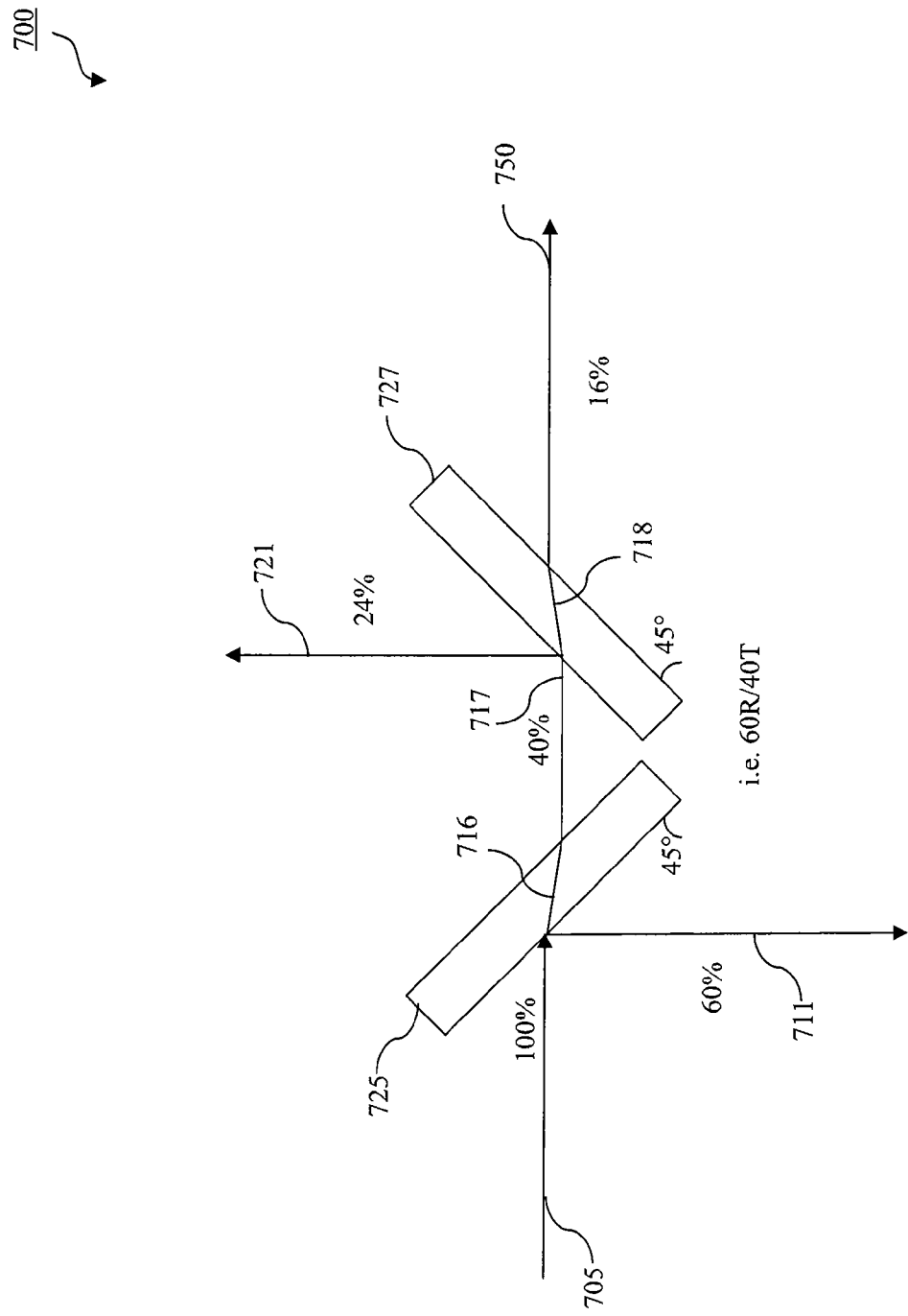
FIG. 7 is an illustration of two beam splitters oriented at approximately 90 degrees from each other, according to an embodiment of the present invention.

FIG. 7 is an illustration of a dual beam splitter 700 (e.g., which can be included in a symmetric beam modifier with adjustable Etendue), according to an embodiment of the invention.

In this example, dual beam splitter 700 includes first beam splitter 725 and second beam splitter 727. In another example, these elements 720 and 725 can be splitter/divergence elements, as discussed above.

In one example, there can be a positional shift in a beam passing through elements 725 and 727 because of a finite thickness of the elements. This is illustrated as path 716 between paths 705 and 717. However, through orienting element 727 approximately perpendicular to element 725, the shift is substantially corrected through beam shift 718, which shifts the beam path between path 717 and 750.

Figure 8:
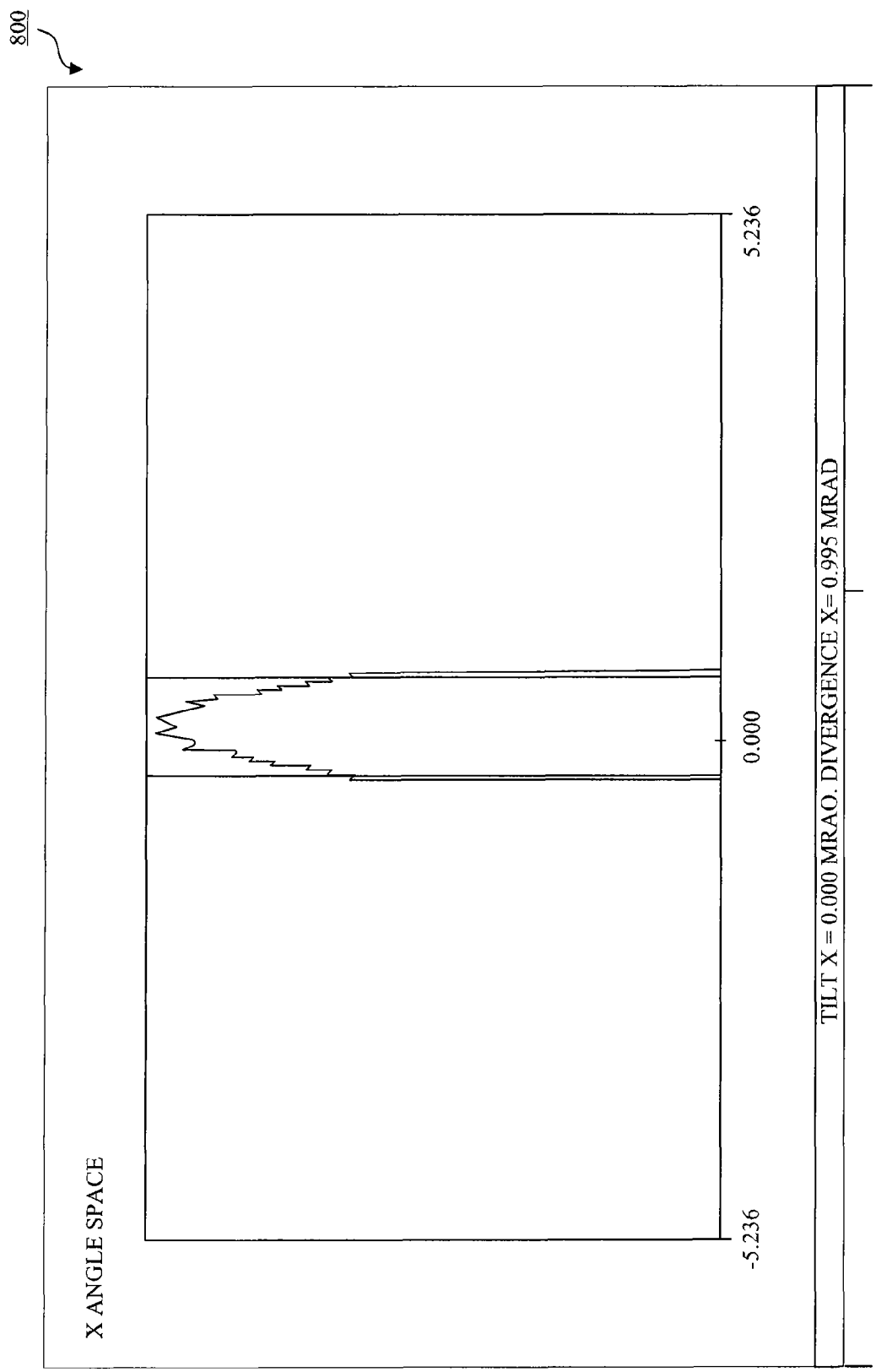
FIGS. 8 and 9 are Zemax simulation examples of divergence of a pulse in a pulse modifier, according to an embodiment of the present invention.
Figure 9:
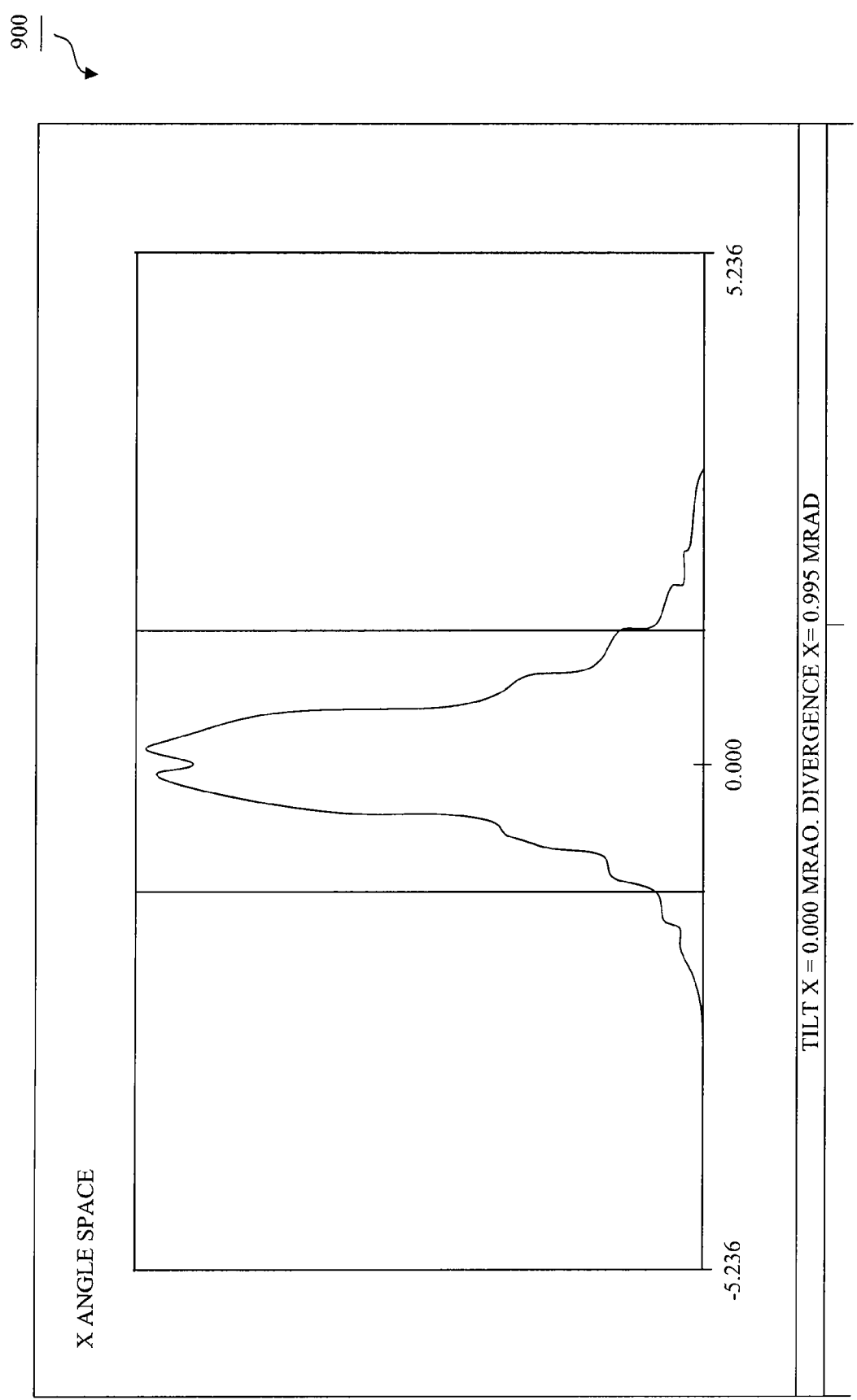

FIGS. 8 and 9 illustrate a Zemax simulation example 800 and 900, according to an embodiment of the present invention.

FIG. 8 illustrates an initial Zemax simulation 800 using the embodiment illustrated in FIG. 4 of a symmetric beam modifier. A tilt angle of the divergence optical elements is set to about 0.00 degrees and delivers a divergence of approximately 1 mrad.

FIG. 9 illustrates simulation 900, which shows a difference resulting from increasing a tilt angle of the divergence optical elements to approximately 0.04 degrees. The divergence is increased to approximately 2.7 mrad. Therefore, by adjusting the amount of divergence angle in each divergence optical element, and adjusting the transmission amounts of the beam splitters, a desired divergence profile can be achieved where Etendue is increased without decreasing the size of the beam.

CONCLUSION

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system, comprising:
   first and second curved reflecting devices;
   a beam splitter; and
   a divergence optical element,
   wherein the beam splitter and the divergence optical element are combined into a single element and are configured to reflect and diverge a first portion of a beam, which begins a cycle during which the beam travels through the system, and to transmit a second portion of the beam to generate at least a portion of an output beam,
   wherein during the cycle the combined beam splitter and divergence optical element direct the first portion of the beam along a beam path between the first and second reflecting devices, such that the first portion of the beam traverses between the first and second reflecting devices more than once,
   wherein the cycle ends after traversal between the first and second reflecting devices, such that a first part of the first portion of the beam is reflected by the combined beam splitter and divergence optical element and exits the system to generate another portion of the output beam and a second part of the first portion of the beam is transmitted through the combined beam splitter and divergence optical element to repeat the cycle.

2. The system of claim 1, wherein:
   a first segment of the cycle comprises a beam path from the first reflecting device to the second reflecting device;
   a second segment of the cycle comprises a beam path from the second curved reflecting device to the first curved reflecting device;
   a third segment of the cycle comprises a beam path from the first curved reflecting device to the second curved reflecting device; and
   a fourth segment of the cycle comprises a beam path from the second curved reflecting device to the beam splitter.

3. The system of claim 1, wherein the first and second curved reflecting devices comprise a confocal mirror.

4. The system of claim 1, wherein the divergence optical element comprises an optical wedge.

5. The system of claim 1, wherein the divergence optical element is configured to substantially reduce or eliminate speckle in the output beam.

6. The system of claim 1, wherein the divergence optical element is configured to increase divergence of the first portion of the beam without decreasing beam size to increase an Etendue of the output beam.

7. The system of claim 1, wherein the first and second curved reflecting devices are configured to delay and reimage the first portion of the beam at the beam splitter.

8. The system of claim 1, wherein the divergence optical element is configured to increase divergence of the first portion of the beam without decreasing beam size to increase a temporal pulse length of the first portion of the beam.

9. The system of claim 1, wherein the divergence optical element is configured to change the divergence of the first portion of the beam through change of an angle of the divergence optical element with respect to the beam splitter and the first and second curved reflecting devices.

10. The system of claim 1, wherein the divergence of the first portion of the beam changes after each cycle of the beam path through subsequent passes through the divergence optical element.

* * * * *